United States Patent [19]
Yokoyama

[11] 4,318,054
[45] Mar. 2, 1982

[54] INPUT CIRCUIT OF AUDIO AMPLIFIER

[75] Inventor: Kenji Yokoyama, Hamamatsu, Japan

[73] Assignee: Nippon Gakki Seizo Kabushiki Kaisha, Hamamatsu, Japan

[21] Appl. No.: 117,271

[22] Filed: Jan. 31, 1980

[30] Foreign Application Priority Data

Feb. 7, 1979 [JP] Japan .................................. 54-12897
Feb. 7, 1979 [JP] Japan ............................ 54-14481[U]
Feb. 7, 1979 [JP] Japan ............................ 54-14482[U]

[51] Int. Cl.³ ...................... H03F 3/183; H03H 11/00
[52] U.S. Cl. .................................... 330/302; 333/214
[58] Field of Search .............. 330/302, 303, 306, 107, 330/109; 333/214, 216; 360/65, 67, 68

[56] References Cited
U.S. PATENT DOCUMENTS 3,571,761 3/1971 Meek .................................. 330/303
4,001,711 1/1977 Knutson et al. .................... 330/306

OTHER PUBLICATIONS

Mitra, Sanjit, "Synthesizing Active Filters", IEEE Spectrum, Jan. 1969, pp. 47–63.

Primary Examiner—James B. Mullins
Assistant Examiner—Gene Wan
Attorney, Agent, or Firm—Frishauf, Holtz, Goodman & Woodward

[57] ABSTRACT

In an audio amplifier circuit in which the base of a bipolar transistor of a first-stage amplifier circuit is direct-coupled to an input terminal which is connected to a signal source such as a phono pickup cartridge, a parallel circuit of a resistor and an inductor is connected between the base of the bipolar transistor and ground. An equivalent inductance circuit for embodying a pure inductance is disclosed.

9 Claims, 8 Drawing Figures pled to the first-stage amplifier 10.
INPUT CIRCUIT OF AUDIO AMPLIFIER

BACKGROUND OF THE INVENTION

This invention relates to an audio amplifier, and more specifically to an input circuit of an audio amplifier capable of being direct-coupled to a signal source.

Generally, a first-stage amplifier circuit of an audio amplifier is formed of a differential amplifier circuit. When the differential amplifier circuit is composed of bipolar transistors, a coupling capacitor is connected between the base of one transistor and an input terminal which is connected to a signal source such as a phono pickup cartridge, and a bias resistor to supply bias voltage to the base of the transistor is connected between the base of the transistor and circuit ground. Since the input impedance of the differential amplifier circuit depends on the bias resistor, the resistance value of this bias resistor cannot be reduced below a certain value. Therefore, a coupling capacitor is used in order not to supply back to the signal source a DC potential established at the base of the transistor, which DC potential is determined by the resistance value of the bias resistor and the value of the base bias current of the transistor in zero-signal condition. In order to apply signals of fully low frequency from the signal source to the differential amplifier circuit, it is necessary to use a coupling capacitor with a considerably large capacitance. It is known, however, that large-capacity coupling capacitors would deteriorate the quality of audio signals.

If the differential amplifier circuit is formed of field effect transistors (FET's) as have frequently been done of late, any current will hardly flow through a bias resistor which is connected between the gate of an FET and circuit ground, owing to the high impedance property of FET's. As a result, the necessity of using a coupling capacitor is obviated. However, since FET's have a lower mutual conductance Gm than that of bipolar transistors, the signal-to-noise ratio of an amplifier using FET's as first-stage amplifying elements will be lowered as compared with that of an amplifier using bipolar transistors.

SUMMARY OF THE INVENTION

An object of this invention is to provide an input circuit of an audio amplifier using a bipolar transistor as a first-stage amplifying element which eliminates the necessity of a coupling capacitor.

Another object of the invention is to provide an equivalent inductance circuit suited for use in the input circuit of an audio amplifier according to the invention.

According to this invention, the base of a bipolar transistor for first-stage amplification is direct-coupled to an input terminal which is to be connected to a signal source, and a parallel circuit of a resistor and a coil or inductor is connected between the base of the bipolar transistor and circuit ground. The input impedance of the first-stage amplifier circuit depends on the resistor, and a base bias current for the bipolar transistor is provided through the coil or inductor. Since DC resistance of the coil or inductor is approximately zero, the base DC potential of the bipolar transistor is substantially zero, allowing the base of the bipolar transistor to be direct-coupled to the signal source. A pure coil or inductor which has no substantial DC resistance may be easily embodied by an equivalent inductance circuit according to this invention.

DETAILED DESCRIPTION OF THE PREFERRED EMBODIMENTS

Figure 1:
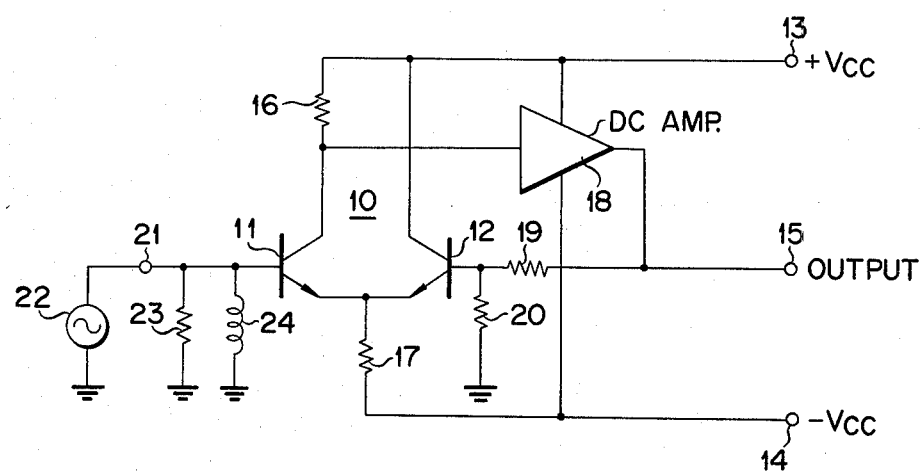
FIG. 1 is a schematic circuit diagram of an audio amplifier with an input circuit according to this invention.

Referring now to FIG. 1 showing an audio amplifier according to a first embodiment of this invention, a first-stage amplifier circuit 10 is a differential amplifier which is comprised of a differential pair of bipolar transistors 11 and 12. The transistor 11 has its collector connected to a positive power supply terminal 13 through a load resistor 16, while the transistor 12 has its collector direct-coupled to the positive power supply terminal 13. The common-connected emitters of transistors 11 and 12 are connected to a negative power supply terminal 14 through a resistor 17. The output of first-stage amplifier 10 or the collector of transistor 11 is connected to an output terminal 15 through a second-stage amplifier 18 which is preferably a direct-coupled amplifier. The output terminal 15 is connected to the base of transistor 12 via a negative feedback network composed of resistors 19 and 20. The base of transistor 11 is direct-coupled to an input terminal 21 which is connected to a signal source 22 such as a phono pickup cartridge. A resistor 23 and a coil or inductor 24 are connected in parallel between the base of transistor 11 and circuit ground. This invention is characterized in that the inpua resistor and a coil or inductor which is connected between the base of bipolar transistor receiving an input signal and circuit ground.

In the circuit of FIG. 1, the input impedance of first-stage amplifier 10 is decided by the resistor 23, and the base current of transistor 11 is supplied from circuit ground through the coil 24. Accordingly, the base bias voltage of transistor 11 is substantially zero volt, so that the base of transistor 11 can be direct-coupled to the input terminal 21. By making the inductance of coil 24 high enough, signals of fully low frequency can be coupled to the first-stage amplifier 10.

The coil 24 has DC resistance as well as inductance. Therefore, the DC base voltage of transistor 11 will not be fully reduced to zero volt, so that a small output offset voltage will appear at the output terminal 15. Pure inductance with no resistance can be obtained by means of an equivalent inductance circuit as mentioned below.

Figure 2:
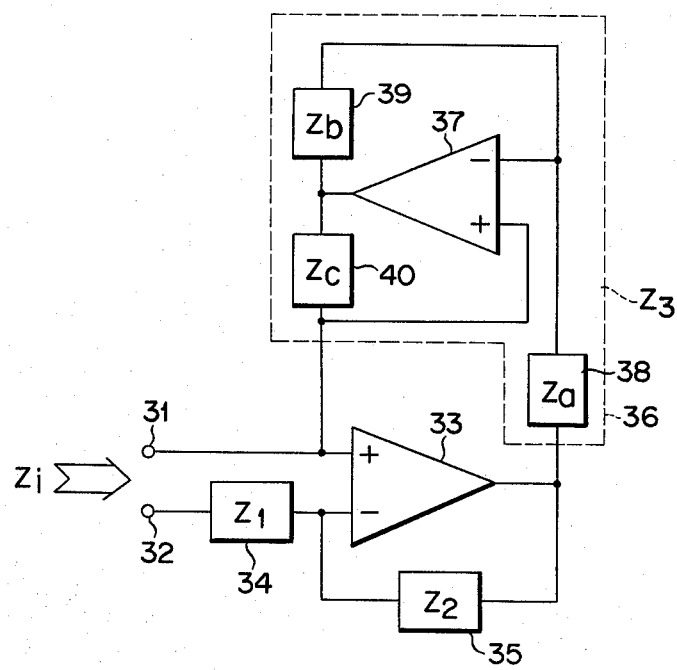
FIG. 2 shows an equivalent impedance circuit according to the invention which provides positive impedance.

FIG. 2 shows an equivalent impedance circuit which can provide a desired reactance, such as inductance or capacitance, between terminals 31 and 32. The terminal 31 is connected to one input—noninverting input in this embodiment—of an operational amplifier 33 which has inverting and noninverting inputs, while the terminal 32 is connected to the other input or inverting input of amplifier 33 through an impedance element 34 which has impedance Z1. An impedance element 35 having impedance Z2 is connected between the output and inverting input of amplifier 33. Further, an impedance element 36 having impedance Z3 is connected between the output and non-inverting input of amplifier 33. The amplifier 33 and the impedance elements 34, 35 and 36 constitute a well-known negative impedance conversion circuit. In this invention, the impedance element 36 is composed of a similar negative impedance conversion circuit which includes an operational amplifier 37 and impedance elements 38, 39 and 40. Namely, the impedance element 38 having impedance Za is connected between the output of the amplifier 33 and one input—inverting input in this embodiment—of the amplifier 37, while the impedance element 39 having impedance Zb is connected between the input of amplifier 37 to which the impedance element 38 is connected and the output of amplifier 37. Moreover, the impedance element 40 having impedance Zc is connected between the output and the other input of amplifier 37.

As generally known, impedance Z1 seen looking into the circuit from the terminals 31 and 32 of the negative impedance conversion circuit which is composed of the amplifier 33 and the impedance elements 34, 35 and 36 may be given by $$Zi = -(Z1 \cdot Z3)/Z2 \quad (1)$$

When the impedance element 36 is formed of the negative impedance conversion circuit as illustrated, the impedance Z3 connected between the output and noninverting input of the amplifier 33 is given by $$Z3 = -(Za \cdot Zc)/Zb \quad (2)$$

Substituting equation (2) into equation (1) yields $$Zi = (Z1 \cdot Za \cdot Zc)/Z2 \cdot Zb) \quad (3)$$

If resistors having resistances R1, R2, R3 and R4 and a capacitor having capacitance C1 are used as the impedance elements 34, 35, 38, 40 and 39 respectively, then equation (3) may be rewritten as follows:

$$Zi = \frac{R1 \cdot R3 \cdot R4}{R2 \cdot \frac{1}{s \cdot C1}} = s \cdot C1 \cdot R3 \cdot R4 \cdot \frac{R1}{R2} \quad (4)$$

where $s = j\omega$.

Figure 3:
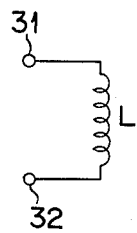
FIG. 3 shows a pure inductance which can be embodied by the equivalent impedance circuit of FIG. 2.

That is, in this case, the equivalent impedance equivalent to a circuit shown in FIG. 3 in which a pure coil with no resistance is connected between the terminals 31 and 32, the inductance L of the coil being given by $C1 \cdot R3 \cdot R4 \cdot (R1/R2)$.

Figure 4:
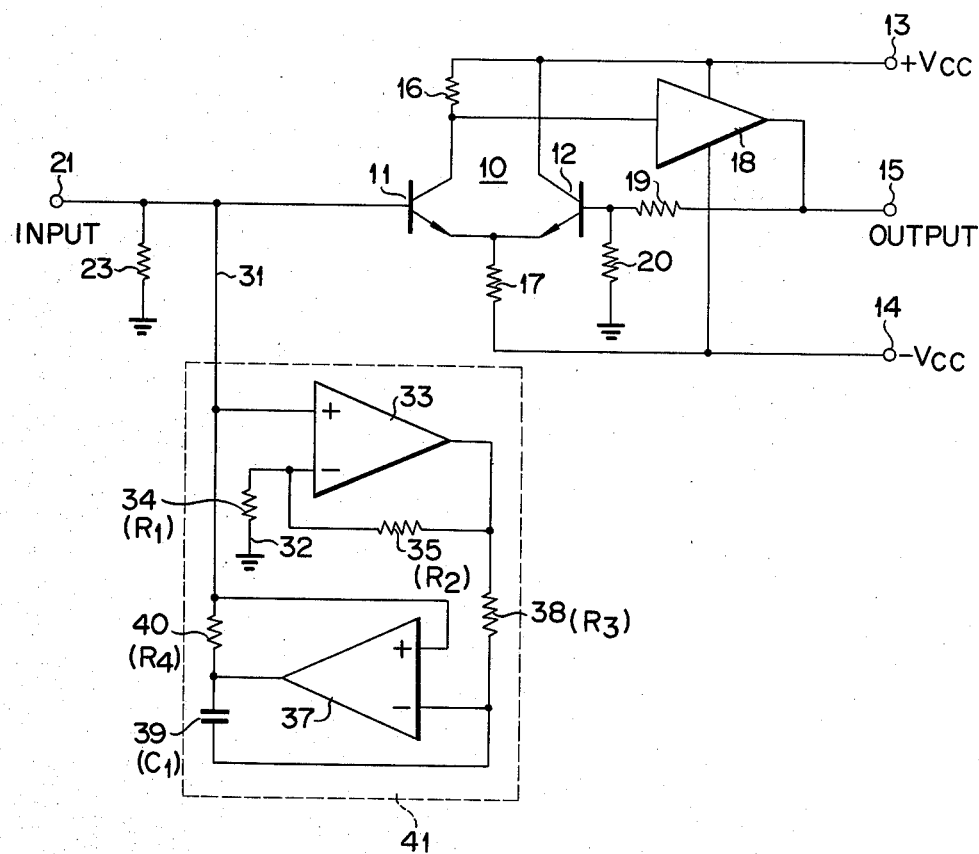
FIG. 4 shows an audio amplifier circuit similar to the circuit shown in FIG. 1 in which inductance is provided by the equivalent impedance circuit of FIG. 2.

FIG. 4 shows an audio amplifier circuit according to another embodiment of this inventin using, instead of the coil 24 of FIG. 1, an equivalent inductance circuit 41 which may be embodied by the impedance circuit of FIG. 2 as mentioned before. In FIG. 4, the same components as those in FIGS. 1 and 2 are designated by like reference numerals, and are excluded from further description. In the circuit of FIG. 4, the terminal 31 of FIG. 2 is connected to the base of transistor 11, while the terminal 32 is connected to ground. With the equivalent inductance circuit of the invention, inductance of a desired value may be obtained in accordance with the values of resistors and capacitor used.

Figure 5:
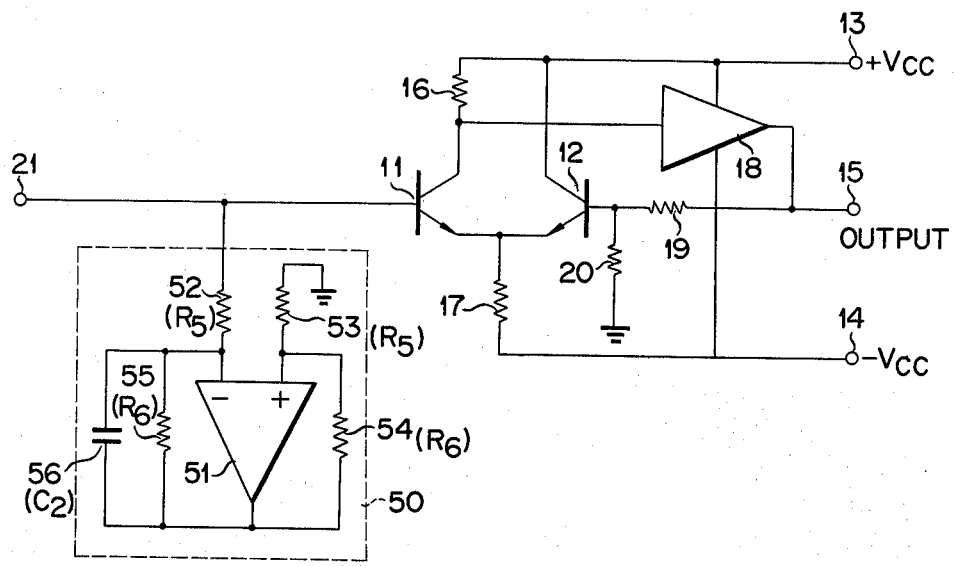
FIG. 5 shows an audio amplifier circuit in which a parallel circuit of a resistor and a coil of the circuit of FIG. 1 is embodied by an equivalent impedance circuit.

FIG. 5 shows an input circuit of an audio amplifier circuit according to still another embodiment of this invention. In this embodiment, the resistor 23 and coil 24 connected in parallel in the circuit of FIG. 1 are embodied by an equivalent impedance circuit 50. In this equivalent impedance circuit 50, the inverting input of an operational amplifier 51 is connected to the input terminal 21 through a resistor 52 having resistance R5, and the noninverting input of amplifier 51 is connected to ground through a resistor 53 having resistance R5. A resistor 54 having resistance R6 is connected between the output and inverting input of the amplifier 51, and a resistor 55 having resistance R6 and a capacitor 56 having capacitance C2 are connected in parallel between the output and inverting input of amplifier 51.

Input impedance Zi of the above-mentioned equivalent impedance circuit 50 is given by $$Zi = (s \cdot C2 \cdot R5 \cdot R6)/(1 + s \cdot C2 \cdot R6) \quad (5)$$

Figure 6:
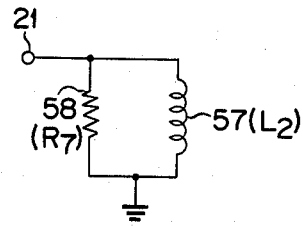
FIG. 6 is an equivalent circuit diagram of the equivalent impedance circuit of FIG. 5.

Equation (5) suggests that the impedance circuit 50 of FIG. 5 is equivalent to a parallel circuit of a pure coil 57 with inductance L2 and a resistor 58 with resistance R7 as shown in FIG. 6. L2 and R7 are given as follows:

$$L2 = C2 \cdot R5 \cdot R6$$

$$R7 = R5$$

Figure 7:
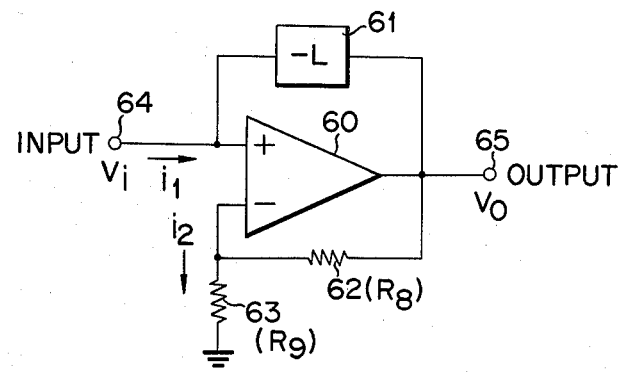
FIG. 7 shows an audio amplifier circuit according to another embodiment of the invention.

FIG. 7 shows an audio amplifier according to a further embodiment of this invention. In the circuit of this embodiment, a negative inductance circuit 61 having inductance $-L$ is connected between the noninverting input and output of a direct-coupled amplifier 60, a resistor 62 having resistance R8 is connected between the output and inverting input of the amplifier 60, and the inverting input of amplifier 60 is connected to ground through a resistor 63 having resistance R9. The noninverting input and output of amplifier 60 are connected to an input terminal 64 and an output terminal 65, respectively.

Assuming that an input signal voltage applied to the input terminal 64 is vi, an output voltage at the output terminal 65 is vo, an input current is i1, and a current flowing through the resistor 63 is i2, as shown in FIG. 7, the following equations hold $$vi - vo = i1 (-sL) \quad (6)$$

$$vo = (R1 + R2) i2 \quad (7)$$

$$vi = R1 \cdot i2 \quad (8)$$

Accordingly, gain Av of the circuit of FIG. 7 and input impedance Zi3 of the circuit as seen from the input terminal 64 are $$Av = vo/vi = 1 + (R8/R9) \quad (9)$$

$$Zi3 = vi/i1 = s \cdot L \cdot (R9/R8) \quad (10)$$

Namely, it will be understood that the circuit of FIG. 7 is equivalent to a circuit in which inductance $L \cdot (R9/R8)$ is connected between the input terminal 64 and ground. DC bias for the amplifier 60 is supplied through the equivalent inductance. Therefore, the DC bias voltage of the amplifier 60 is zero volt, so that a signal source can be connected directly to the input terminal 64 without utilizing a coupling capacitor.

Figure 8:
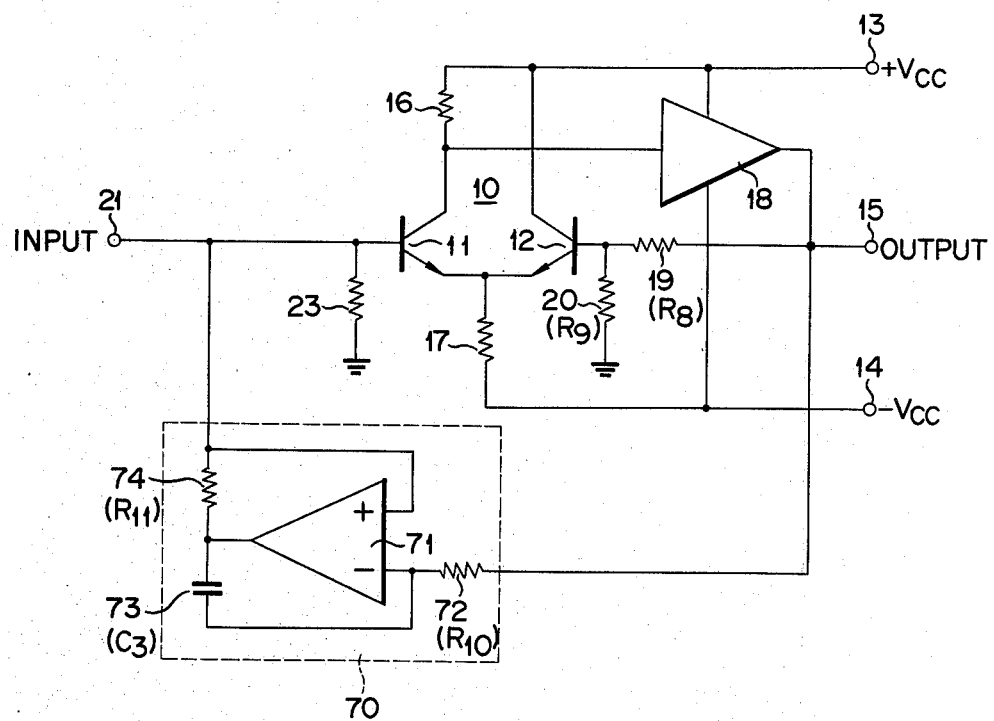
FIG. 8 shows an example of a practical circuit diagram of the circuit of FIG. 7.

The circuit of FIG. 7 may be obtained by connecting a negative inductance circuit 70 between the output terminal 15 and the input terminal 21, as shown in FIG. 8, instead of using the coil 24 of the circuit of FIG. 1. of an operational amplifier 71, a resistor 72 having resistance R10 and connected between the inverting input of amplifier 71 and the output terminal 15, a capacitor 73 having capacitance C3 and connected between the inverting input and output of the amplifier 71, and a resistor 74 having resistance R11 and connected between the output of amplifier 71 and the input terminal 21. The noninverting input of amplifier 71 is connected to the input terminal 21. The transistors 11 and 12, the resistors 16 and 17, and the amplifier 18 constitute the amplifier 60 of FIG. 7.

The inductance of the negative inductance circuit 70 between the input and output terminals 21 and 15 is given by $L = -C3 \cdot R10 \cdot R11$.

The circuit of FIG. 8 is equivalent to a modification of the circuit of FIG. 2 in which Z1, Z2, Za, Zb and Zc are replaced by R9, R8, R10, C3 and R11 respectively, the terminal 31 is connected to receive input signals, the output of amplifier 33 is connected to the output terminal 15, and the terminal 32 is connected to ground.

In the above-mentioned embodiments of the invention, the first-stage amplifier circuit is not limited to the differential amplifier circuit, and any circuit using a bipolar transistor as an input amplifying element may be utilized.

According to this invention, as described above, the base of an input bipolar transistor can be connected directly to the input terminal of the amplifier circuit which is to be connected to a signal source, so that distortion is reduced, and the quality of sound will be improved. Using the bipolar transistors for the first-stage amplifier circuit, the amplifier circuit of this invention is advantageous in S/N ratio and simple in configuration.

What is claimed is:

1. An input circuit of an audio amplifier with an input terminal to be connected to a signal source, comprising:
    a first-stage amplifier circuit including as an amplifying element a bipolar transistor the base of which is direct-coupled to said input terminal without a capacitor coupled therebetween; and
    a parallel circuit of a resistor and an inductance connected between the base of said bipolar transistor and circuit ground.

2. An input circuit according to claim 1 wherein said inductance comprises an equivalent inductance circuit.

3. An input circuit according to claim 2 wherein said equivalent inductance circuit includes first and second amplifiers each having first and second inputs and an output, said first input being one of noninverting and inverting inputs and said second input being the other, said first inputs of said first and second amplifiers being connected to the base of said bipolar tansistor, a first resistor connected between said second input of said first amplifier and circuit ground, a second resistor connected between said output and second input of said first amplifier, a third resistor connected between said output of said first amplifier and said second input of said second amplifier, a capacitor connected between said output and second input of said second amplifier, and a fourth resistor connected between said output and first input of said second amplifier.

4. An input circuit according to claim 1 wherein said parallel circuit of said inductance and resistor comprises by an equivalent impedance circuit.

5. An input circuit according to claim 4 wherein said equivalent impedance circuit includes an amplifier having first and second inputs and an output, said first input being one of noninverting and inverting inputs and said second input being the other, a first resistor connected between said first input of said amplifier and the base of said bipolar transistor, a second resistor connected between said second input of said amplifier and circuit ground, a third resistor connected between said second input and output of said amplifier, a fourth resistor connected between said first input and output of said amplifier, and a capacitor connected in parallel with said fourth resistor.

6. An audio amplifier with an input terminal to be connected to a signal source, comprising:
    a first amplifier having noninverting and inverting inputs and an output, said noninverting input being direct-coupled to said input terminal;
    a first resistor connected between said output and inverting input of said first amplifier;
    a second resistor connected between said inverting input of said first amplifier and circuit ground; and
    a negative inductance circuit connected between said output and noninverting input of said first amplifier.

7. An audio amplifier according to claim 6 wherein said negative inductance circuit includes a second amplifier having first and second inputs and an output, said first input being one of noninverting and inverting inputs and said second input being the other, a third resistor connected between said output of said first amplifier and said first input of said second amplifier, a capacitor connected between said output and first input of said second amplifier, and a fourth resistor connected between said output and second input of said second amplifier.

8. An equivalent impedance circuit to provide positive impedance between first and second terminals, comprising:
    a first amplifier having first and second inputs and an output, said first input being one of noninverting and inverting inputs and said second input being the other, said first input being connected to said first terminal;
    a second amplifier having first and second inputs and an output, said first input being one of noninverting and inverting inputs and said second input being the other, said first input of said second amplifier being connected to said first terminal;
    a first impedance element connected between said second input of said first amplifier and said second terminal;
    a second impedance element connected between said output and second input of said first amplifier;
    a third impedance element connected between said output of said first amplifier and said second input of said second amplifier;
    a fourth impedance element connected between said output and second input of said second amplifier; and
    a fifth impedance element connected between said output and first input of said second amplifier.

9. An equivalent impedance circuit according to claim 8 wherein said first, second, third and fifth impedance elements are resistors, and said fourth impedance element is a capacitor.

* * * * *